(12) United States Patent
Zuolo et al.

(10) Patent No.: US 11,398,291 B2
(45) Date of Patent: Jul. 26, 2022

(54) METHOD AND APPARATUS FOR DETERMINING WHEN ACTUAL WEAR OF A FLASH MEMORY DEVICE DIFFERS FROM RELIABILITY STATES FOR THE FLASH MEMORY DEVICE

(71) Applicant: Microchip Technology Inc., Chandler, AZ (US)

(72) Inventors: Lorenzo Zuolo, Lusia (IT); Rino Micheloni, Turate (IT)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 17/213,675

(22) Filed: Mar. 26, 2021

(65) Prior Publication Data

US 2022/0165348 A1    May 26, 2022

Related U.S. Application Data

(60) Provisional application No. 63/116,303, filed on Nov. 20, 2020.

(51) Int. Cl.
*G11C 29/00* (2006.01)
*G11C 29/42* (2006.01)
(Continued)

(52) U.S. Cl.
CPC ............ *G11C 29/42* (2013.01); *G06K 9/6256* (2013.01); *G06N 3/063* (2013.01);
(Continued)

(58) Field of Classification Search
CPC ... G11C 29/42; G11C 29/12005; G11C 29/44; G11C 29/50004; G11C 2029/1202
See application file for complete search history.

(56) References Cited

U.S. PATENT DOCUMENTS 6,567,313 B2   5/2003   Tanaka et al.
6,704,871 B1   3/2004   Kaplan et al.
(Continued)

OTHER PUBLICATIONS

Noam Shazeer et al: Outrageously Large Neural Networks: The Sparsely-Gated Mixture-of-Experts Layer11 , arxiv .org, Cornell University Li bra ry, 201 Olin Li bra ry Cornell University Ithaca, NY 14853, Jan. 23, 2017.
(Continued)

*Primary Examiner* — Mohammed A Bashar
(74) *Attorney, Agent, or Firm* — Glass and Associates; Kenneth Glass

(57) ABSTRACT

A method and apparatus for determining when actual wear of a flash memory device differs from a reliability state. Configuration files of a reliability-state classification neural network model are stored. The operation of a flash memory device is monitored to identify current physical characteristic values. A read of the flash memory device is performed to determine a number of errors. A neural network operation is performed using as input a set of threshold voltage shift offset values currently being used to perform reads of the flash memory device and the calculated number of errors, to identify a predicted reliability state. The identified current physical characteristic values are compared to corresponding tags associated with the predicted reliability state and a flag or other indication is stored when the comparison indicates that the identified current physical characteristic values do not correspond to the respective tags associated with the predicted reliability state.

18 Claims, 8 Drawing Sheets

(51) Int. Cl.
  *G11C 29/44* (2006.01)
  *G11C 29/12* (2006.01)
  *G06K 9/62* (2022.01)
  *G06N 3/063* (2006.01)
  *G11C 29/50* (2006.01)

(52) U.S. Cl.
  CPC ........ *G11C 29/12005* (2013.01); *G11C 29/44* (2013.01); *G11C 29/50004* (2013.01); *G11C 2029/1202* (2013.01)

(56) References Cited

U.S. PATENT DOCUMENTS

| | | | |
|---|---|---|---|
| 7,529,215 B2 | 5/2009 | Osterling et al. |
| 7,650,480 B2 | 1/2010 | Jiang |
| 7,930,623 B2 | 4/2011 | Pisek et al. |
| 8,429,325 B1 | 4/2013 | Onufryk et al. |
| 8,621,318 B1 | 12/2013 | Micheloni et al. |
| 8,656,257 B1 | 2/2014 | Micheloni et al. |
| 8,665,648 B2 | 3/2014 | Mun et al. |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 8,966,335 B2 | 2/2015 | Lunelli et al. |
| 8,971,112 B2 | 3/2015 | Crippa et al. |
| 8,990,661 B1 | 3/2015 | Micheloni et al. |
| 9,092,353 B1 | 7/2015 | Micheloni et al. |
| 9,128,858 B1 | 9/2015 | Micheloni et al. |
| 9,235,467 B2 | 1/2016 | Micheloni et al. |
| 9,268,531 B1 | 2/2016 | Woo et al. |
| 9,292,428 B2 | 3/2016 | Kanamori et al. |
| 9,305,661 B2 | 4/2016 | Micheloni et al. |
| 9,397,701 B1 | 7/2016 | Micheloni et al. |
| 9,417,804 B2 | 8/2016 | Micheloni et al. |
| 9,444,655 B2 | 9/2016 | Sverdlov et al. |
| 9,448,881 B1 | 9/2016 | Micheloni et al. |
| 9,450,610 B1 | 9/2016 | Micheloni et al. |
| 9,454,414 B2 | 9/2016 | Micheloni et al. |
| 9,590,656 B2 | 3/2017 | Micheloni et al. |
| 9,747,200 B1 | 8/2017 | Micheloni |
| 9,799,405 B1 | 10/2017 | Micheloni et al. |
| 9,813,080 B1 | 11/2017 | Micheloni et al. |
| 9,886,214 B2 | 2/2018 | Micheloni et al. |
| 9,892,794 B2 | 2/2018 | Micheloni et al. |
| 9,899,092 B2 | 2/2018 | Micheloni |
| 10,152,273 B2 | 12/2018 | Micheloni et al. |
| 10,157,677 B2 | 12/2018 | Marelli et al. |
| 10,230,396 B1 | 3/2019 | Micheloni et al. |
| 10,283,215 B2 | 5/2019 | Marelli et al. |
| 10,291,263 B2 | 5/2019 | Marelli et al. |
| 10,332,613 B1 | 6/2019 | Micheloni et al. |
| 10,861,562 B1 | 12/2020 | Xiong et al. |
| 2006/0106743 A1* | 5/2006 | Horvitz ................. G06N 7/005 706/21 |
| 2006/0282603 A1 | 12/2006 | Onufryk et al. |
| 2007/0076873 A1 | 4/2007 | Yamamoto et al. |
| 2011/0255453 A1 | 10/2011 | Roh et al. |
| 2012/0166714 A1 | 6/2012 | Mun et al. |
| 2012/0287719 A1 | 11/2012 | Mun et al. |
| 2014/0281800 A1 | 9/2014 | Micheloni et al. |
| 2014/0281823 A1 | 9/2014 | Micheloni et al. |
| 2014/0310534 A1 | 10/2014 | Gurgi et al. |
| 2015/0033037 A1 | 1/2015 | Lidman |
| 2016/0072527 A1 | 3/2016 | Suzuki et al. |
| 2016/0247581 A1 | 8/2016 | Suzuki et al. |
| 2016/0266791 A1 | 9/2016 | Lin et al. |
| 2017/0213597 A1 | 7/2017 | Micheloni |
| 2018/0033490 A1 | 2/2018 | Marelli et al. |
| 2020/0074269 A1* | 3/2020 | Trygg ..................... G06F 17/18 |
| 2020/0210831 A1 | 7/2020 | Zhang et al. |

OTHER PUBLICATIONS

Yu Cai et al, "Errors in Flash-Memory-Based Solid-State Drives: Analysis, Mitigation, and Recovery" 11 , arxiv. org, Cornell University Library, 201 Olin Library Cornell University Ithaca, NY 14853, Nov. 28, 2017.
U.S. Appl. No. 17/347,388, filed Jun. 14, 2021, Lorenzo Zuolo.
U.S. Appl. No. 17/398,091, filed Aug. 10, 2021, Lorenzo Zuolo.
U.S. Appl. No. 17/506,735, filed Oct. 21, 2021, Lorenzo Zuolo.
U.S. Appl. No. 17/089,891, filed Nov. 5, 2020, Lorenzo Zuolo.
U.S. Appl. No. 17/148,200, filed Jan. 13, 2021, Lorenzo Zuolo.
U.S. Appl. No. 17/213,675, filed Mar. 26, 2021, Lorenzo Zuolo.
U.S. Appl. No. 63/057,278, filed Jul. 27, 2020, Lorenzo Zuolo.
PCT/US2021/030228, International Search Report and Written Opinion, European Patent Office, dated Aug. 12, 2021.

* cited by examiner

Threshold Voltage Shift Offset

Threshold Voltage Shift Offset

200

```
┌─────────────────────────────────────────────────────────────────────────┐ ─ 201
│ Generating a reliability-state CNN model configured to identify         │
│ reliability states for a flash memory device                            │
└─────────────────────────────────────────────────────────────────────────┘
                                   │                                       ─ 202
                                   ▼
┌─────────────────────────────────────────────────────────────────────────┐
│ Storing on a flash memory controller or on a memory device that is      │
│ coupled to the flash controller, configuration files of a reliability-  │
│ state CNN model and one or more TVSO value (Opt. stored TVSO            │
│ value(s) are FCT-TVSO value(s) used in the training of the reliability- │
│ state CNN model and not removed from the training data set during the   │
│ training of the reliability-state CNN model)                            │
└─────────────────────────────────────────────────────────────────────────┘
                                   │
                                   ▼
        ┌──────────────────────────────────────────────────────┐ ─ 203
        │ Monitoring the operation of a flash memory device to │
        │ identify one or more current physical characteristic │
        │ values of the flash memory device (Opt. P/E cycles,  │
        │ retention time and read-disturb values)              │
        └──────────────────────────────────────────────────────┘
                                   │                          ─ 204
                                   ▼
        ┌──────────────────────────────────────────────────────┐
        │ Identify a set of TVSO values currently being used   │
        │ to perform reads of the flash memory device          │
        │ (TVSO-RC values)                                     │
        └──────────────────────────────────────────────────────┘
                                   │                          ─ 205
                                   ▼
        ┌──────────────────────────────────────────────────────┐
        │ Performing a read of the flash memory device at the  │     210
        │ stored TVSO value(s) to determine a number of errors │
        │ (CR-ERROR) (Opt. all TVSO values for the read are    │
        │ "0" except for one TVSO value)                       │
        └──────────────────────────────────────────────────────┘
                                   │                          ─ 206
                                   ▼
        ┌──────────────────────────────────────────────────────┐
        │ Performing a neural network operation of the         │
        │ reliability-state CNN model, using as input the      │
        │ identified set of TVSO-RC values and the determined  │
        │ CR ERRORS to identify a predicted reliability state  │
        └──────────────────────────────────────────────────────┘
                                   │                     209
                                   ▼                ─ 207   ┌────────────┐
        ┌──────────────────────────────────────────┐        │ Change page│
        │ Comparing the identified current physical│        │ or wordline│
        │ characteristic values to corresponding   │        └────────────┘
        │ tags associated with the predicted       │              ▲
        │ reliability state                        │              │
        └──────────────────────────────────────────┘              │
                                   │                              │
                                   ▼                              │
                            ╱─────────────╲  208  Yes             │
                          ╱ Do identified   ╲────────────────────┘
                         ╱ current physical  ╲
                         ╲ characteristic    ╱
                          ╲ values correspond╱
                           ╲ to respective  ╱
                            ╲ tags?        ╱
                             ╲────────────╱
                                   │ No                          ─ 211
                                   ▼
┌─────────────────────────────────────────────────────────────────────────┐
│ Storing a flag or other indication when the comparison indicates that   │
│ the identified current physical characteristic values do not correspond │
│ to the respective tags associated with the predicted reliability state  │
│ (Opt. identified current physical characteristic values include a       │
│ number of P/E cycles, retention time, read disturb and temperature      │
│ values and the tags associated with the predicted reliability state     │
│ include a tag indicating a range of program and erase cycles, retention │
│ times, temperatures and read disturb values, the comparing determining  │
│ that the identified current physical characteristic values do not       │
│ correspond to the tags associated with the predicted reliability state  │
│ when the number of program and erase cycles, retention times,           │
│ temperatures or read disturb values are not within the range of         │
│ program and erase cycles, retention times, temperatures or read disturb │
│ values) (Opt. Store flag in data storage module)                        │
└─────────────────────────────────────────────────────────────────────────┘
```

FIG. 10

METHOD AND APPARATUS FOR DETERMINING WHEN ACTUAL WEAR OF A FLASH MEMORY DEVICE DIFFERS FROM RELIABILITY STATES FOR THE FLASH MEMORY DEVICE

CROSS-REFERENCE TO RELATED APPLICATIONS

The present application claims priority to U.S. Provisional Patent Application Ser. No. 63/116,303 filed on Nov. 20, 2020, the contents of which are incorporated by reference herein in their entirety.

BACKGROUND

Some Solid State Drives (SSD's) include flash controllers that use threshold-voltage-shift reads for reading flash memory devices to obtain low levels of Uncorrectable Bit Error Rate (UBER) required for client and enterprise SSD's. Threshold-voltage-shift reads are performed by sending a threshold-voltage-shift read instruction to a flash memory device that is to be read. One or more Threshold-Voltage-Shift Offset (TVSO) value is sent with the threshold-voltage-shift read instruction. The TVSO value indicates the amount by which each threshold voltage that is used to perform the read is to be offset from a corresponding default threshold voltage that is specified by the manufacturer of the flash memory device. Multi-level cell (MLC) flash memory devices store two bits of information in each cell and require three TVSO values for each read, triple level cell (TLC) flash memory devices store three bits of information in each cell and require seven TVSO values for each read; quad level cell (QLC) flash memory devices store four bits of information in each cell and require 15 TVSO values for each read; and penta level cell (PLC) flash memory devices store five bits of information in each cell and require 31 TVSO values for each read.

A Flash characterization testing process is performed to identify the best TVSO values to use in performing reads of a particular flash memory device, commonly referred to as Threshold-Voltage-Shift-Offset-minimum (TVSOmin) values. TVSOmin values are usually a set of TVSO values that produce the least errors when reading the flash memory device at testing conditions corresponding to a particular reliability state. However, there are many different processes for determining TVSOmin values and in many instances the sets of TVSOmin values identified during flash characterization testing are not necessarily the actual TVSO values that produces the least errors, but rather are sets of TVSO values that meet one or more performance metric such as, for example, a particular Raw Bit Error Rate (RBER).

Flash controllers that use threshold voltage shift read instructions for performing reads typically include firmware for monitoring physical characteristics of the flash memory devices and use the monitored physical characteristics for determining the TVSO value(s) to use in performing reads of each flash memory device. The TVSO value(s) to be used for performing the read (referred to hereinafter as "TVSO Read-Current" values or TVSO-RC values) are typically determined prior to each read by the flash memory controller based on the physical location to be read (e.g., block/page) and the current physical characteristics of the flash memory device to be read as measured by the flash controller, by performing a look-up operation in a look-up table using the physical location to be read and the measured current physical characteristics of the flash memory device (e.g., number of program/erase cycles, retention time, and/or number of read disturbs for the block to be read). The TVSO-RC values are usually one of the sets of TVSOmin values identified in flash characterization testing. Though monitoring the physical characteristics gives good results in most situations, when a physical structure of a flash device is not what would be expected given the measured physical characteristics (e.g., when the structure on the flash device ages prematurely) the TVSO-RC value used to perform the read may not be correct, resulting in a read error. When this occurs the firmware, or software stack controlling/managing the flash memory devices, of the flash controller does not recognize the error until an Error Correction Code (ECC) in, or associated with, the flash controller fails to correct a page that is being read. This means that ECC error recovery flow processes, or in some cases redundant array of independent disks (RAID) processes, are necessary to recover the user's data. This has a significant impact on the SSD's bandwidth, latency and Quality of Service (QoS).

Another problem with conventional systems is that, when the firmware image of the flash controller is corrupted during a firmware update or upgrade, at startup of the SSD the flash controller must run a foreground threshold voltage shift calibration on all blocks of all flash memory devices in the SSD, which is a lengthy process. The user cannot access the SSD until this process is complete and the reliability state is rebuilt, which also impacts the SSD's bandwidth, latency and QoS.

Some flash controllers monitor retention time and temperature. One problem with such systems is the fact that retention time and temperature are only monitored when the SSD is operating. However, when the SSD is in a low-power or powered down state, the retention time during the low-power or powered down state, conventionally referred to as "offline-retention time" is not known and temperature (offline-temperature) during that time is also not known. This can result in the use of an incorrect TVSO-RC value for performing a read, that may result in read errors, which impacts the drive's bandwidth, latency and QoS.

Accordingly, there is a need for a method and apparatus that can provide an indication when a physical structure of a flash device is not what would be expected given the measured physical characteristics of the device. Also, there is a need for a method and apparatus will allow for faster recovery when the firmware image is corrupted during a firmware update or upgrade. In addition, there is a need for a method and apparatus that will compensate for the effects of offline-retention time and offline-temperature when the SSD has been in a low-power or powered down state.

SUMMARY OF THE INVENTION

A method for generating a reliability-state classification neural network (CNN) model for a flash memory device that can be read by sending to the flash memory device a threshold-voltage-shift read instruction that includes a TVSO value for each threshold voltage region required for reading the flash memory device includes indicating testing criteria and a training algorithm. Training data files are received that indicate, for each of a plurality of different wordlines, a Flash Characterization Testing Error (FCT-ERROR) value indicating a number of flash characterization testing errors, a label indicating one of the reliability states and a set of TVSOmin values indicating a TVSOmin value for each threshold voltage region required to read the flash memory device. Training is performed to generate the reliability-state CNN model using a training data set that includes the received training data files, where the reliability-state CNN model is configured to predict the reliability state of the flash memory device. The reliability-state CNN model is tested to determine if the reliability-state CNN model can predict each of the reliability states using the training data set. The testing includes determining whether the testing criteria are met for each of the reliability states. When the trained classification neural network model fails to meet the testing criteria for a particular reliability state, the method includes removing from the training data files corresponding to the reliability state failing to meet the testing criteria training data files having a nonzero TVSO value in a particular TVSO region, to form an updated training data set. The training and testing steps are then repeated using the updated training data set. When testing criteria are met for each of the reliability states, configuration files for the reliability-state CNN model are stored. Optionally, one or more set of FCR-TVSO values that has not been removed from the training data set is also identified and stored.

A method for determining when actual wear of a flash memory device differs from one of a plurality of reliability states for the flash memory device includes storing configuration files of a reliability-state classification neural network (CNN) model on a flash controller or on a memory device that is coupled to the flash controller, the reliability-state CNN model configured to identify the reliability states for the flash memory device; storing one or more Threshold Voltage Shift Offset (TVSO) values; monitoring the operation of the flash memory device to identify one or more current physical characteristic values of the flash memory device; and identifying a set of TVSO values currently being used to perform reads of the flash memory device. A read of the flash memory device is performed at the stored one or more TVSO value to determine a number of errors for the flash memory device. A neural network operation of the reliability-state CNN model is performed, using as input the set of TVSO values currently being used to perform reads of the flash memory device and the determined number of errors for the flash memory device, to identify a predicted reliability state. The identified current physical characteristic values are compared to corresponding tags associated with the predicted reliability state. A flag or other indication is stored when the comparison indicates that the identified current physical characteristic values do not correspond to the respective tags associated with the predicted reliability state.

A flash controller includes a write module configured to write data to a flash memory device; a read module configured to perform a read of the flash memory device by sending a threshold-voltage-shift read instruction to the flash memory device that includes a Threshold Voltage Shift Offset (TVSO) value for each threshold voltage region required for reading the flash memory device, a decode module configured to decode the results of the read, and a status module for monitoring the operation of the flash memory device to identify one or more current physical characteristic values. A data storage module is configured for storing configuration files of a reliability-state classification neural network (CNN) model that is configured to identify reliability states for the flash memory device and configured for storing one or more TVSO value that was used in the training of the reliability-state CNN model. A control module is coupled to the data storage module, the control module configured to identify a set of TVSO values currently being used to perform reads of the flash memory device and configured to instruct the read module to perform a read of the flash memory device at the stored one or more TVSO value. In response to the instruction, the read module is configured to perform the read of the flash memory device at the stored one or more TVSO value and the decode module is configured to determine a number of errors using the results of the one or more read. A neural processing module is coupled to the data storage module and to the control module. The neural processing module is configured to perform a neural network operation using the stored configuration files and using as input to the neural network operation the identified set of TVSO values currently being used to perform reads of the flash memory device and the determined number of errors to identify a predicted reliability state. The control module is configured to compare the identified current physical characteristic values to corresponding tags associated with the predicted reliability state and to store a flag or other indication when the comparison indicates that the identified current physical characteristic values do not correspond to the tags associated with the predicted reliability state.

BRIEF DESCRIPTION OF THE DRAWINGS

The accompanying drawings are included to provide a further understanding of the invention, and are incorporated in, and constitute a part of, this specification. The drawings illustrate various embodiments.

FIG. 10 is block diagram illustrating method for determining when actual wear of a flash memory device differs from one of a plurality of reliability states for the flash memory device.

DETAILED DESCRIPTION

Figure 1:
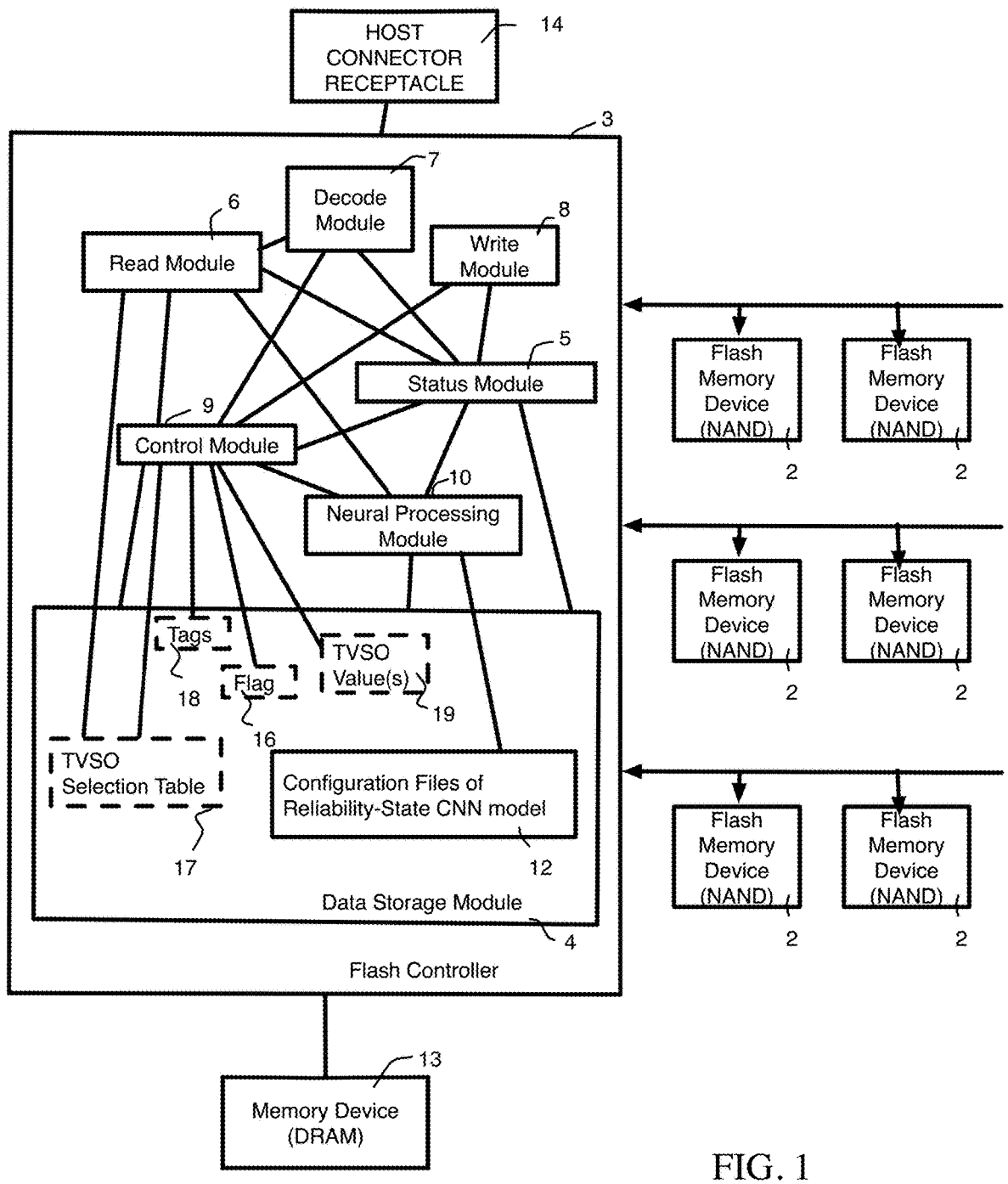
FIG. 1 is a block diagram illustrating an SSD.

An SSD 11 is shown in FIG. 1 to include a flash controller 3 coupled to a plurality of flash memory devices 2 for storing data. In the present embodiment, the flash memory devices 2 are NAND devices and SSD 11 includes one or more circuit boards onto which a host connector receptacle 14, flash controller 3 and flash memory devices 2 are attached. SSD 11 may also include one or more memory device 13 such as a Dynamic Random Access Memory (DRAM), that may be a separate integrated circuit device attached to the one or more circuit boards, and is electrically coupled to flash controller 3.

Flash controller 3 is configured to receive read and write instructions from a host computer through host connector receptacle 14, and to perform program operations, erase operations and read operations on memory cells of flash memory devices 2 to complete the instructions from the host computer. For example, upon receiving a write instruction from the host computer via host connector receptacle 14, flash controller 3 is operable to store data in SSD 11 by performing program operations (and when required, erase operations) to program codewords into on one or more flash memory device 2.

Flash controller 3 includes data storage module 4, status module 5, read module 6, decode module 7, write module 8, neural processing module 10 and control module 9. Control module 9 is coupled to data storage module 4, status module 5, read module 6, decode module 7, write module 8 and neural processing module 10. Status module 5 is coupled to data storage module 4, read module 6, decode module 7, write module 8, control module 9 and neural processing module 10. Data storage module 4 stores configuration files of Reliability-State CNN model 12, optional TVSO selection table 17, and one or more optional flag 16. TVSO selection table 17 is coupled to read module 6. TVSO selection table 17 includes one or more index and corresponding TVSO values to be used in performing reads (e.g., an index corresponding to a block, a wordline or a page and TVSO values for each threshold voltage region required to perform a read).

Read module 6 is further coupled to control module 9, neural procession module 10 and decode module 7. Control module 9 is further coupled to decode module 7, neural processing module 10, and to data storage module 4. Data storage module 4 includes flags 16, optional TVSO selection table 17, tags 18, TVSO values 19 (that are all coupled to control module 9). Neural processing module 10 is coupled to data storage module 4 such that configuration files of reliability-State CNN model 12 can be loaded thereon.

In one example, neural processing module 10 includes a specialized hardware module (e.g., a specialized configurable accelerator) specifically configured to perform a neural network operation, sometimes referred to as a neural network engine (e.g., a programmable logic circuit). Alternatively, neural processing module 10 can include a processor 34 and software for performing neural network operations.

In the present embodiment flash controller 3 is an integrated circuit device and some or all of modules 5-10 include circuits that may be dedicated circuits for performing operations, and some or all of modules 5-10 may be firmware that includes instructions that are performed on one or more processor 34 for performing operations of flash controller 3, with the instructions stored in registers 21 of one or more of modules 5-10 and/or stored in data storage module 4 or memory device 13. In this embodiment some of all of modules 5-10 include processors 34 for performing instructions and one or more firmware image is loaded into flash controller 3 (e.g., through host connector receptacle 14) prior to operation of flash controller 3, the firmware image including instructions to be performed by one or more of modules 5-10.

Figure 2:
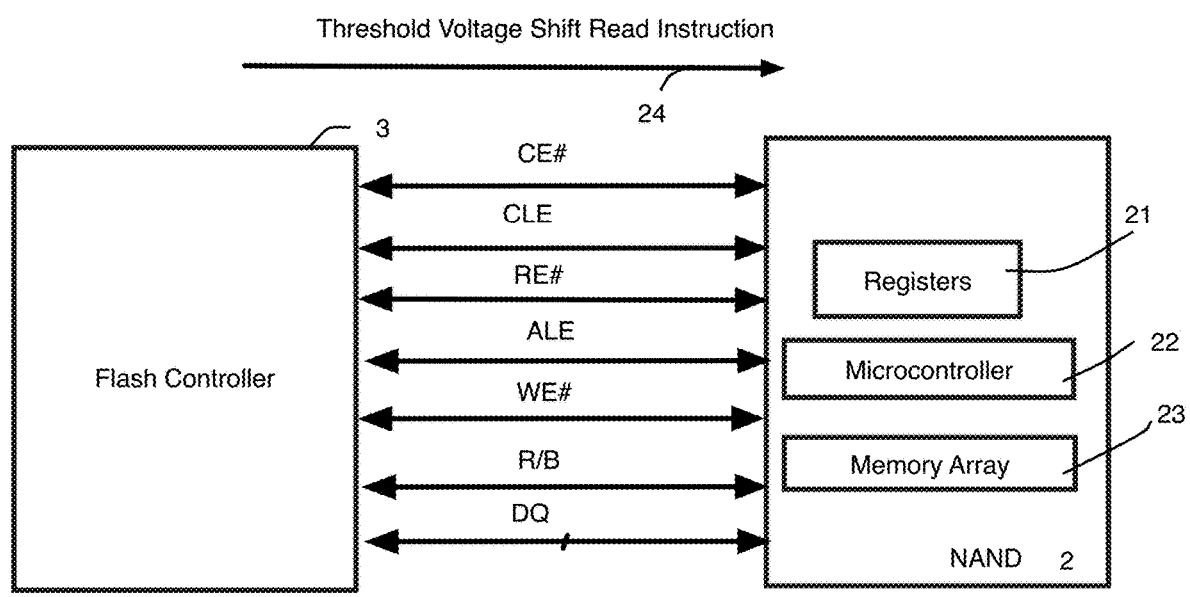
FIG. 2 is a diagram illustrating a flash controller and a NAND flash memory device and illustrates communication between the flash controller and the flash memory device.

Each flash memory device 2 may be a packaged semiconductor die or "chip" that is coupled to flash controller 3 by conductive pathways that couple instructions, data and other information between each flash memory device 2 and flash controller 3. In the embodiment shown in FIG. 2 each flash memory device 2 (e.g., a NAND device) includes registers 21, a microcontroller 22 and a memory array 23, and is coupled to flash controller 3 by a chip enable signal line (CE #), a command latch enable signal line (CLE), a read enable signal line (RE #), an address latch enable signal line (ALE), a write enable signal line (WE #), a read/busy signal line (R/B) and input and output signal lines (DQ). Upon receiving a write instruction from a host computer, write module 8 is operable to encode received data into a codeword that is sent to registers 21 along with a corresponding program instruction. Microcontroller 22 is operable to perform the requested program instruction and retrieve the codeword from register 21 and store the codeword in memory array 23 by programming cells of memory array 23 (e.g., as a logical page). Microcontroller 22 is also operable to erase cells of memory array 23.

In one example, each flash memory device 2 includes NAND memory cells that are organized into blocks and pages, with each block composed of NAND strings that share the same group of wordlines. Each logical page is composed of cells belonging to the same wordline, however in MLC flash memory devices multiple logical pages may correspond with single wordline. The number of logical pages within each logical block is typically a multiple of 16 (e.g. 64, 128). In the present embodiment, a logical page is the smallest addressable unit for reading from, and writing to, the NAND memory cells of each flash memory device 2 and a logical block is the smallest erasable unit. However, it is appreciated that in various embodiments, programming less than an entire logical page may be possible, depending on the structure of the NAND array. Though flash memory devices 2 are illustrated as being NAND devices, it is appreciated that flash memory devices 2 may be any type of memory storage device that uses a threshold voltage for reading memory cells of the flash memory device 2. The terms programming and writing are used interchangeably throughout this document.

Flash memory devices 2 may be SLC, MLC, TLC QLC or PLC NAND devices. In the present embodiment flash memory devices 2 are capable of performing a wide range of threshold-voltage-shift reads, including reads specified by whole number offset values such as $-n \ldots -2, -1, 0, +1, +2 \ldots n$ without limitation.

An erased block of a flash memory device 2 may be referred to as a "free block." When data is programmed into a block that has been erased the block is referred to as an "open block" until all pages of the block have been programmed. Once all pages of the block have been programmed the block is referred to as a "closed block" until it is again erased.

Figure 3:
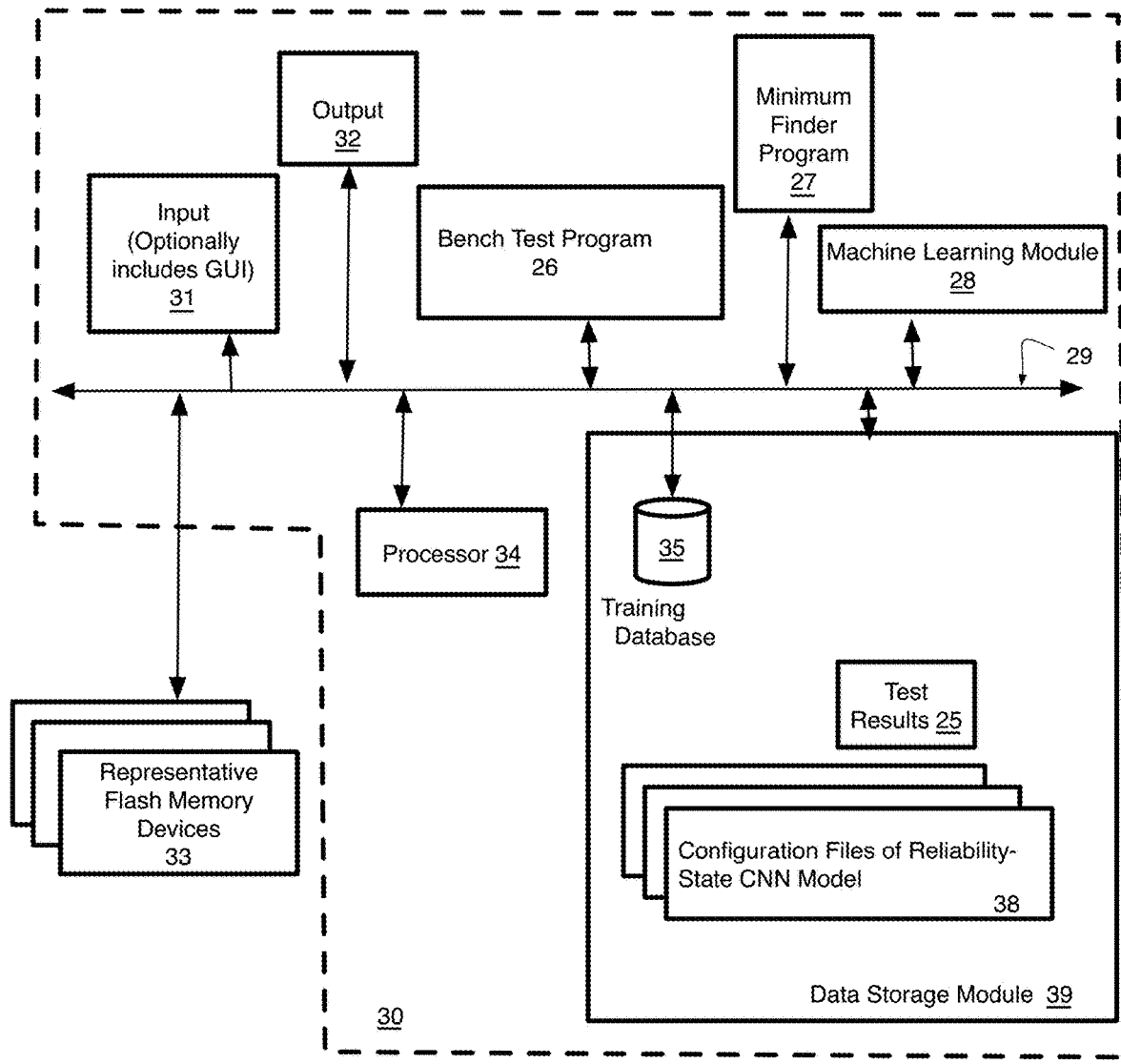
FIG. 3 is a diagram illustrating a testing and model generation system.

FIG. 3 illustrates a test and model generation system 30 that may be used for generating a reliability-state CNN model. The system includes an input 31, an output 32, a processor 34, a data storage module 39, a machine learning module 28 and a minimum finder program 27 that are coupled together via a network 29. Minimum finder program 27 is a software program operable on processor 34, and may thus represent electronically readable instructions. Data storage module 39 comprises test results 25, configuration files of reliability-state CNN model(s) 38 and a training database 35.

Test and model generation system 30 also includes a bench test program 26, which may represent electronically readable instructions, that is operable on processor 34 for testing representative flash memory devices 33 in such a way as to identify the number of errors that occur as the representative flash memory devices 33 age. Representative flash memory devices 33 may be inserted into one or more test fixture that couples to test and model generation system 30. Representative flash memory devices 33 are devices that are similar to, or identical to, flash memory devices 2, and may be the same type of device (e.g. the same type of NAND device), made by the same manufacturer as flash memory devices 2. Machine learning module 28 may represent electronically readable instructions, that is operable on processor 34 for generating a neural network model such as the neural network model represented by configuration files of reliability-state CNN model(s) 38, and may include a computer program operable on processor 34. Machine learning module 28 may be a software program operable on processor 34 that can generate neural network models as is known in the art.

Figure 4:
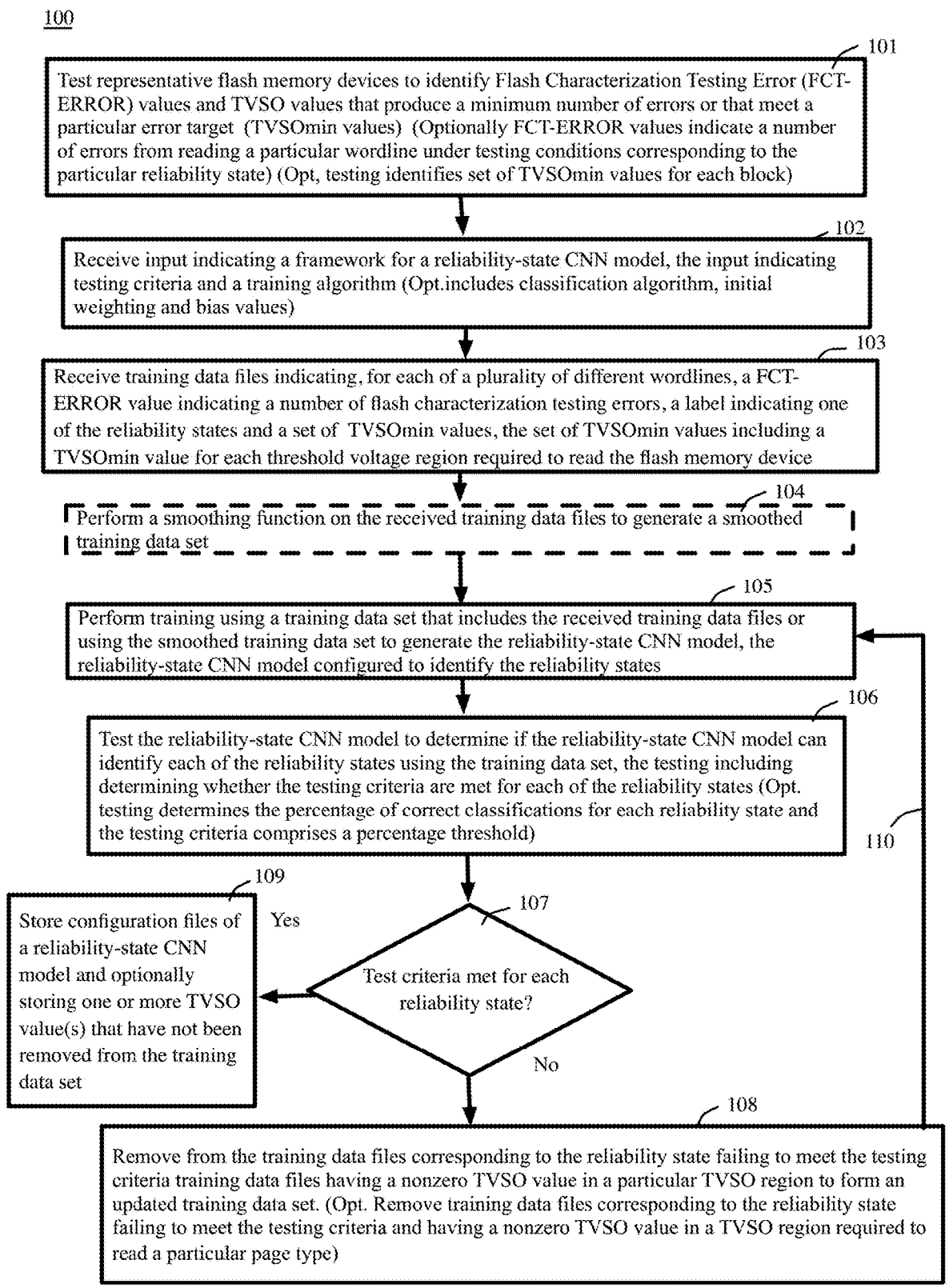
FIG. 4 is block diagram illustrating a method for generating a reliability-state CNN model.

FIG. 4 illustrates a method 100 for generating a reliability-state CNN model for determining when actual wear of a flash memory device differs from one of a plurality of reliability states for the flash memory device. Representative flash memory devices are tested (101) to identify a number of flash characterization testing errors (FCT-ERROR values) for each wordline for each of a plurality of cycling conditions (where each cycling condition corresponds to a particular reliability state). The term cycling condition refers to a combination of PE cycles (PE), retention time (RET), read disturb cycles (RD), and temperature (T). Since the number of cycling conditions are infinite, this is simplified into ranges. In one example, test and model generation system 30 is operable to test representative flash memory devices 33 to identify FCT-ERROR values by performing reads of all wordlines of each representative flash memory device 33 at a plurality of different TVSO values under testing conditions corresponding to the particular reliability state. In one embodiment the TVSO values and the FCT-ERROR features for all the reliability states are characterized.

The testing of step 101 also determines, for each reliability state, TVSO values that are to be used to perform reads during that reliability state, referred to hereinafter as "TVSOmin values". In the present embodiment TVSOmin values are the TVSO values that provide the minimum number of read errors when reading memory cells (e.g., of a particular wordline and/or block) under testing conditions corresponding to a particular reliability state. Alternatively, TVSOmin values may be values that meet a particular error target such as, for example a particular RBER. The term "TVSOmin," as used in the present application is a value indicating a TVSO that is to be used for performing reads of a particular threshold voltage region of a flash memory device 2 that produces a minimum number of errors or that meets a particular error target when used to read the particular flash memory device 2 at testing conditions corresponding to a particular reliability state.

In the following examples TVSO values are indicated using the format "TVSOn", where n indicates the threshold voltage region specified by a manufacturer of the flash memory device 2. More particularly, first TVSO region values ($TVSO_1$) indicate a TVSO for reading a first threshold voltage region, second TVSO region values ($TVSO_2$) indicate a TVSO for reading a second threshold voltage region, third TVSO region values ($TVSO_3$) indicate a TVSO for reading a third threshold voltage region, fourth TVSO region values ($TVSO_4$) indicate a TVSO for reading a fourth threshold voltage region, fifth TVSO region values ($TVSO_5$) indicate a TVSO for reading a fifth threshold voltage region specified by a manufacturer of the flash memory, sixth TVSO region values ($TVSO_6$) indicate a TVSO for reading a sixth threshold voltage region, seventh TVSO region values ($TVSO_7$) indicate a TVSO for reading a seventh threshold voltage region, and so on.

The TVSO value(s) that are used to perform a read in step 101 to identify the number of FCT-ERRORs will be referred to as a Flash-Characterization-Read-Threshold-Voltage Shift Offset (FCR-TVSO) values and may be represented in the form FCR-TVSO ($TVSO_1$) for a read of a SLC nonvolatile representative flash memory device 33, FCR-TVSO ($TVSO_1$, $TVSO_2$, $TVSO_3$) for a read of a MLC nonvolatile memory device 33, FCR-TVSO ($TVSO_1$, $TVSO_2$, $TVSO_3$, $TVSO_4$, $TVSO_5$, $TVSO_6$, $TVSO_7$) for a read of a TLC nonvolatile memory device 33; FCR-TVSO ($TVSO_1$, $TVSO_2$, $TVSO_3$, $TVSO_4$, $TVSO_5$, . . . $TVSO_{15}$) for a read of a TLC nonvolatile memory device 33, and FCR-TVSO ($TVSO_1$, $TVSO_2$, $TVSO_3$, $TVSO_4$, $TVSO_5$, . . . $TVSO_{31}$) for a read of a PLC nonvolatile memory device 33.

In one example, one wordline is tested by reading each page of the wordline at each TVSO value that the representative flash memory device 33 is capable of reading at. When representative flash memory device 33 is capable of reads at threshold voltage shift offsets between −n and +n, reads of each page of the wordline to be tested are performed by a "scanning operation" in which reads are performed at offsets between −n and +n for each TVSO region that is required to read the particular representative flash memory device 33.

In one example in which each page of a wordline to be tested is read a single time at each of −24 to +24, forty nine data records 60a are generated for each wordline at testing conditions corresponding to each reliability state when representative flash memory device 33 is a SLC device. More particularly a first read is performed at a FCR-TVSO (−24) to obtain a value indicating the number of errors in the read (a first FCT-ERROR value), a second read is performed at a FCR-TVSO (−23) to obtain a value that indicates the number of errors in the second read (a second FCT-ERROR value) and so forth, performing reads and identifying the number of errors in reads at a $TVSO_1$ values of: −24, −23, −22, −21, −20 . . . 0, +1, +2 . . . +24.

When more than one threshold voltage region is required to read a particular wordline scans are performed by setting one TVSO region to a scan value and setting the other TVSO regions to a value of zero, where the scan value is initially set at the lowest TVSO value that the representative flash memory device 33 is capable of reading at and incremented by one after each read, and the scanning process is repeated for each TVSO region required to read representative flash memory device 33. In one example in which flash memory device 33 is a MLC device, three scans are performed of each wordline, one scan for each TVSO region required to read the wordline. For example, for a first wordline and a first reliability state, a first scan is performed by performing a first read at: FCR-$TVSO_1$=−24, a FCR-$TVSO_2$=0 and a FCR-$TVSO_3$=0, that may be represented in the form FCR-TVSO (−24, 0, 0) to obtain a first FCT-ERROR value; performing a second read at FCR-TVSO (−23, 0, 0) to obtain a second FCT-ERROR value; and performing reads at FCR-TVSO (−22,0,0), FCR-TVSO (−21,0,0), FCR-TVSO (−20,0,0) . . . FCR-TVSO (0,0,0), (FCR-TVSO (+1,0,0), FCR-TVSO (+2,0,0), . . . FCR-TVSO (+24,0,0), to obtain a total of 49 FCT-ERROR values for the first wordline and the first reliability state. A second scan is performed by reading the first wordline at FCR-TVSO (0,−24,0), FCR-TVSO (0,−23,0), FCR-TVSO (0,−22,0), . . . FCR-TVSO (0,−1,0), FCR-TVSO (0,+1,0) . . . FCR-TVSO (0,+23,0), FCR-TVSO (0,+24,0) for a total of 48 additional reads (since (0,0,0) was previously read) to obtain 48 additional FCT-ERROR values for the first wordline and the first reliability state. A third scan is performed by reading at FCR-TVSO (0,0,−24), FCR-TVSO (0,0,−23), FCR-TVSO (0,0,−22) . . . FCR- TVSO (0,0−1), FCR-TVSO (0,0,+1) . . . FCR-TVSO (0,0,+23), FCR-TVSO (0,0,+24) to obtain 48 additional FCT-ERROR values (since 0,0,0 was previously read). Thus, the three scans of the wordline perform 145 reads and provide 145 FCT-ERROR values for the first wordline and first reliability state. This process is repeated for each wordline of each representative flash memory device 33 to be tested and each reliability state.

In one example in which each wordline to be tested is read a single time at TVSO values from −24 to +24, where the representative flash memory device 33 is a TLC flash device, seven scans are performed on each wordline, one scan for each TVSO region required to read the wordline. For example, for each wordline a first scan is performed in which $TVSO_1$ is scanned from −24 to +24 while the other TVSO regions are set to a value of "0" in each read (e.g., a read at FCR-TVSO (−24,0,0,0,0,0,0) to obtain a first FCT-ERROR value; a read at FCR-TVSO (−23,0,0,0,0,0,0) to obtain a second FCT-ERROR value; and so forth, for a total of 49 reads and 49 corresponding FCT-ERROR values). A second scan is performed in which $TVSO_2$ is scanned from −24 to +24 (excluding "0", since FCR-TVSO=0,0,0,0,0,0,0 has already been read) while the other FCR-TVSO regions are set to a value of "0" in each read (e.g., a read at FCR-TVSO (0,−24,0,0,0,0,0) to obtain a first FCT-ERROR value; a read at FCR-TVSO (0,−23,0,0,0,0,0) to obtain a second FCT-ERROR value, and so forth for a total of 48 additional reads and 48 additional data records for the first wordline). A third scan is performed in which $TVSO_3$ includes scanned values while the other TVSO regions are set to a value of "0" in each read for a total of 48 additional reads and 48 corresponding ERROR values for the first wordline and the first reliability state. A fourth scan is performed in which $TVSO_4$ includes scanned values while the other TVSO regions are set to a value of "0" in each read. A fifth scan is performed in which $TVSO_5$ includes scanned values while the other TVSO regions are set to a value of "0" in each read; a sixth scan is performed in which $TVSO_6$ includes scanned values while the other TVSO regions are set to a value of "0" in each read; and a seventh scan is performed in which $TVSO_7$ includes scanned values while the other TVSO regions are set to a value of "0" in each read.

In one example in which each representative flash memory device 33 is a QLC flash device, fifteen scans are performed on each wordline, one scan for each TVSO region required to read the wordline. For example, for a first wordline and a first reliability state a first scan is performed in which $TVSO_1$ is scanned from −24 to +24 while the other TVSO regions are set to a value of "0" in each read of the first wordline (e.g., by performing a read at FCR-TVSO (−24,0,0,0,0,0,0,0,0,0,0,0,0,0,0) to obtain a first FCT-ERROR value; performing a read at FCR-TVSO (−23,0,0,0,0,0,0,0,0,0,0,0,0,0,0) to obtain a second FCT-ERROR value; and so forth, for a total of 49 reads and 49 corresponding FCT-ERROR values). Subsequent scans are performed in the same manner as with a QLC flash memory device until all fifteen TVSO regions have been scanned.

In one example in which the representative flash memory device 33 is a PLC flash device, thirty-one scans are performed on each wordline, one scan for each TVSO region required to read the wordline. As in the previous examples, for each wordline a first scan is performed in which FCR-$TVSO_1$ is scanned from −24 to +24 while the other TVSO regions are set to a value of "0" in each read, a second scan is performed in which FCR-$TVSO_2$ is scanned from −24 to +24 (excluding 0) while the other TVSO regions are set to a value of "0" in each read, and so forth.

Figure 6:
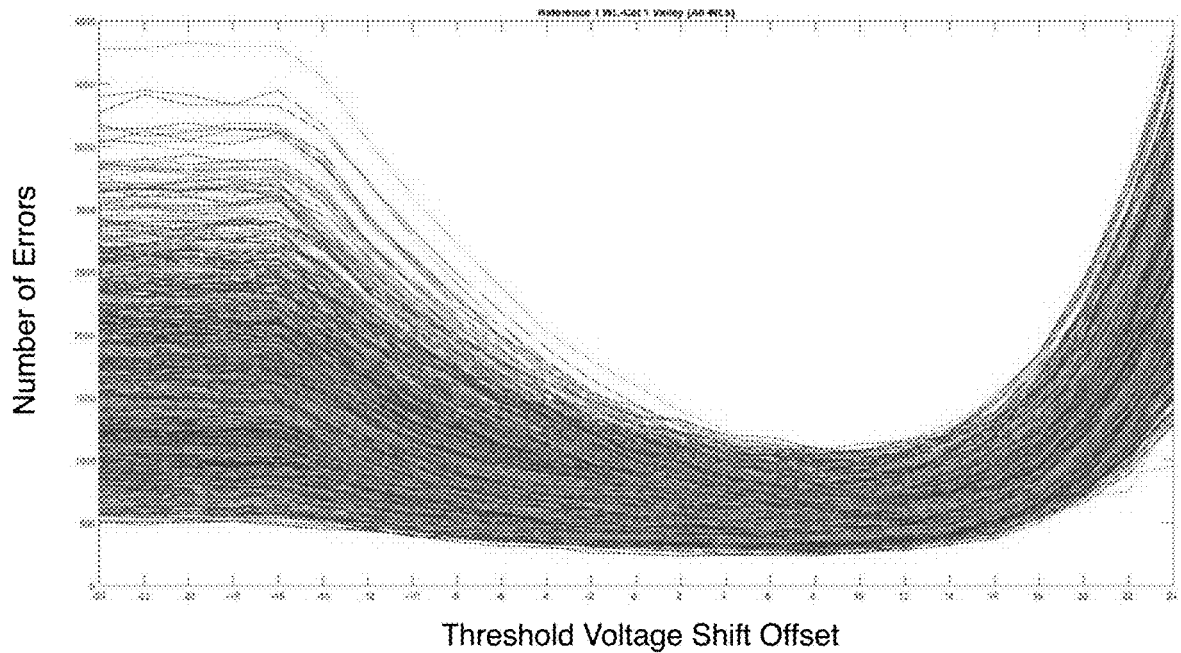
FIG. 6 is a graph illustrating exemplary threshold-voltage-shift read-error curves generated from an exemplary threshold-voltage shift-read training data set.

FIG. 6 shows an example of Threshold-Voltage-Shift Read-Error (TVS-RE) curves generated by scanning representative flash memory devices 33 having FCR-TVSO values from −24 to +24, each TVS-RE curve identifying a number of errors as a function of FCR-TVSO values. More particularly, the number of errors is shown on the y-axis and FCR-TVSO is shown on the x-axis.

In the embodiment shown in FIG. 3, using testing conditions corresponding to each reliability state bench test program 26 is operable to test representative flash memory devices 33 to identify TVSOmin values for performing reads of wordlines in each block for each reliability state and the computed TVSOmin values are stored in test results 25. In one example each scan for a particular wordline and a particular reliability state generates a curve as illustrated in FIG. 6.

In one example, for each reliability state each block uses a single set of TVSOmin values for reading wordlines of the particular block, with minimum finder program 27 operable to use the computed TVSOmin values for each wordline to identify a TVSOmin for each block of representative flash memory devices 33. Accordingly, for each reliability state SLC flash memory devices will have a single TVSOmin for each block, MLC flash memory devices will have three TVSOmin values for each block (TVSO1min, TVSO2min, TVSO3min), where TVSO1min is the TVSOmin value for reading a first threshold voltage region, TVSO2min is the TVSOmin value for reading a second threshold voltage region and TVSO3min is the TVSOmin value for reading a third threshold voltage region of a wordline in the particular block. TLC flash memory devices will have seven TVSOmin values (TVSO1min, TVSO2min, TVSO3min, TVSO4min, TVSO5min, TVSO6min, TVSO7min) for each block. QLC flash memory devices will have fifteen TVSOmin values (TVSO1min, TVSO2min . . . TVSO15min) for each block. PLC flash memory devices will have thirty one TVSOmin values (TVSO1min, TVSO2min . . . TVSO31min) for each block. In other embodiments, for each reliability state a set of TVSOmin values is provided for each wordline, for or groups of wordlines in each block.

Input indicating a framework for a classification neural network (CNN) model is received (102). The framework includes testing criteria and a training algorithm. In one example, one or more files indicating the framework of the CNN model is received through input 31 and temporarily stored in data storage module 39. Alternatively, input 31 includes a graphical user interface that allows for entry of the input of step 102. In one example, the framework includes one or more file that indicates one or more of: hyperparameters for the neural network model, the number of input neurons, the number of hidden neurons, the number of output neurons, the connections between neurons, initial bias values, initial weighting values, testing criteria and the training algorithm to use (e.g., a particular classification algorithm).

Training data files are received (103) indicating, for each of a plurality of different wordlines, TVSO min values for each threshold voltage region required to read the flash memory device, an FCT-ERROR value indicating a number of flash characterization testing errors and a label indicating a corresponding one of the reliability states. The TVSO values received in step 103 may be the TVSOmin values calculated in step 101 that provide a minimum number of errors or meet a particular error target for the block that includes the particular wordline.

In one example the testing of step 101 is performed on one or more representative flash memory devices 33 by reading each wordline of the representative flash memory device 33 at cycling conditions corresponding to one of the reliability states. The reads are performed at different FCR-TVSO values and the results of the reads are used to form the training data files received in step 103. The training data files received in step 103 include a training data record corresponding to each read that includes an index value identifying the wordline that was read, an FCT-ERROR value, and a TVSOmin for each threshold voltage region required to read the wordline. Each record also includes an index value that indicates a reliability state (RSI) corresponding to the cycling conditions of the read that was performed.

Figure 5A:
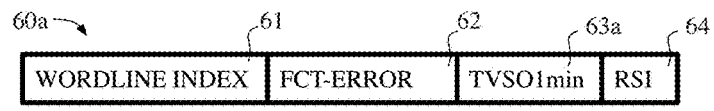
FIG. 5A-5E are block diagrams illustrating exemplary data records.

FIG. 5A shows a training data record 60*a* for a SLC flash memory device that includes an index value identifying a wordline (WORDLINE INDEX) 61, an FCT-ERROR value 62, a TVSOmin value (TVSO1min) 63*a* indicating the offset for reading the representative flash memory device 33 and an index value (RSI) 64 that indicates the reliability state corresponding to the cycling conditions of the read.

Figure 5B:
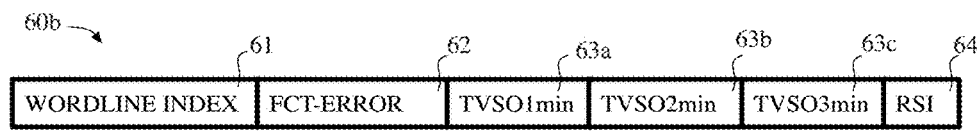

FIG. 5B shows a training data record 60*b* for a MLC flash memory device that includes a wordline (WORDLINE INDEX) 61, an FCT-ERROR value 62, a TVSO1min value 63*a* a TVSO2min value 63*b*, a TVSO3min value 63*c* and an index value (RSI) 64 that indicates the corresponding reliability state (e.g., the reliability state corresponding to the cycling conditions used to determine FCT-ERROR value 62).

Figure 5C:
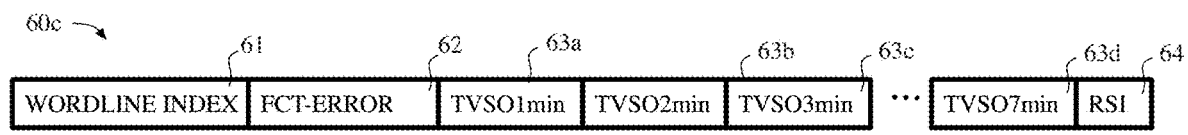

FIG. 5C shows a training data record 60*c* for a TLC flash memory device that includes an index value identifying a wordline (WORDLINE INDEX) 61, an FCT-ERROR value 62, TVSO1min value 63*a*, TVSO2min value 63*b*, a TVSO3min value 63*c*, a TVSO4min value, a TVSO5min value, a TVSO6min value, a TVSO7min value 63*d* and an index value (RSI) 64.

Figure 5D:
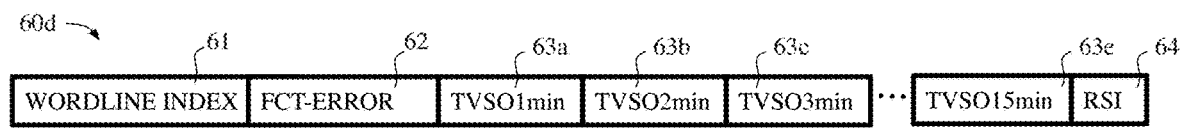

FIG. 5D shows a training data record 60*d* for a QLC flash memory device that includes a WORDLINE INDEX 61, an FCT-ERROR value 62, a TVSO1min value 63*a*, a TVSO2min value 63*b*, a TVSO3min value 63*c*, and so forth to a fifteenth TVSOmin value (TVSO15min) 63*e* and an index value (RSI) 64.

Figure 5E:
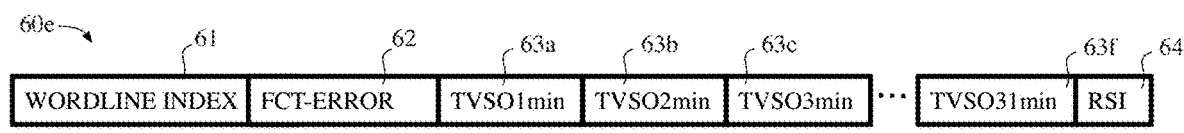

FIG. 5E shows a training data record 60*e* for a PLC flash memory device that includes WORDLINE INDEX 61, an FCT-ERROR value 62, a TVSO1min value 63*a*, a TVSO2min value 63*b*, a TVSO3min value 63*c*, and so forth to a thirty first TVSO31min value 63*f* and an index value (RSI) 64.

In one example training data files (either training data records 60*a*, 60*b*, 60*c*, 60*d* or 60*e*) are stored in a training database 35.

Training is performed (105) using a training data set that includes the received training data files (or optionally a threshold-voltage-shift-read training data set comprising smoothed training data) to generate the reliability-state CNN model. The reliability-state CNN model 12 is configured to identify the reliability states. In one example, the training algorithm is a Random forest algorithm. The generated reliability-state CNN model is tested (106) to determine if the reliability-state CNN model can identify each of the reliability states using data in the training data files (or the smoothed training data), the testing including determining whether the testing criteria are met for each of the reliability states. The testing can include performing neural network operations using as input the FTC-ERROR values and TVSOmin values from some or all of the training data records to predict a reliability state for each training data record. Each predicted reliability state is then compared to the reliability state indicated in the corresponding training data record to determine whether the correct reliability state is predicted. In one example the testing of step 106 includes determining a percentage of correct classifications for each reliability state and the testing criteria comprises a percentage threshold. In this example, if a percentage threshold of 95 percent, without limitation, is received in step 102, if the percentage of correct classifications is below the percentage threshold of 95 percent, the testing fails to meet the testing criteria for the particular reliability state.

Figure 7:
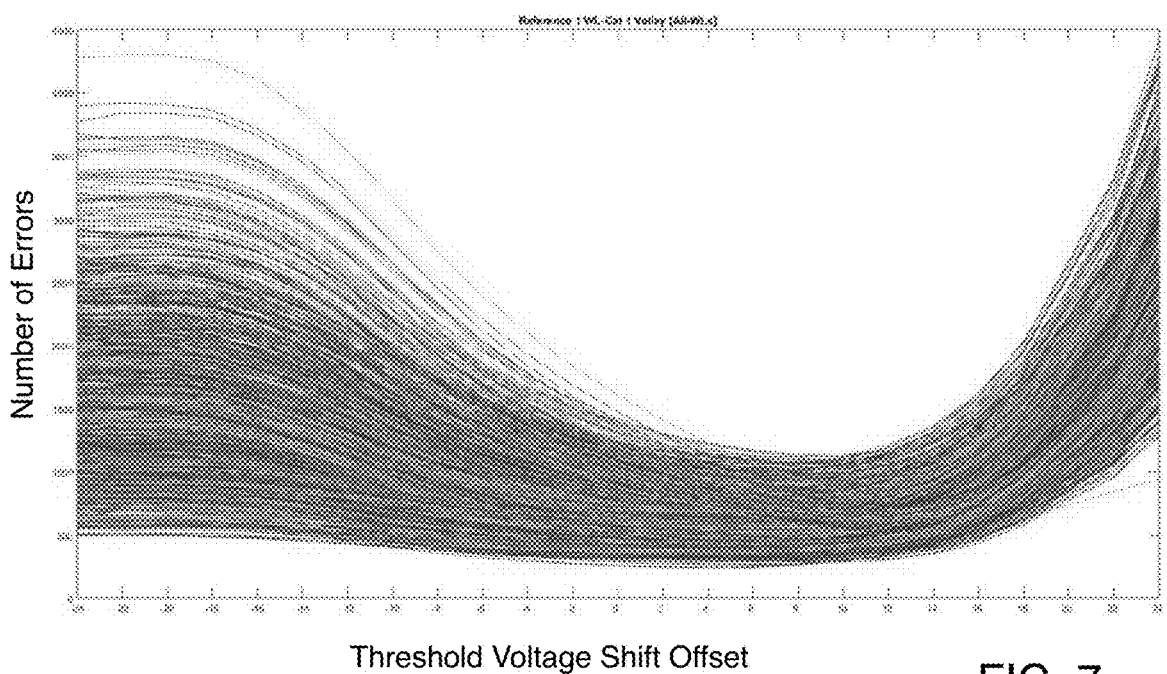
FIG. 7 is a graph illustrating exemplary smoothed threshold-voltage-shift read-error curves generated from an exemplary smoothed threshold-voltage shift-read training data set.

As can be seen in FIG. 6, because of the nature of the NAND flash read circuitry there are fluctuations (noise) in the number of errors of each valley. This noise negatively impacts the learning process of the CNN inference model which may lead to incorrect classification errors. To avoid this problem a smoothing function (e.g., an algorithm such as a moving average or multi-polynomial interpolation) is optionally applied to the training data set as is shown by optional step 104 to generate a smoothed threshold-voltage-shift-read training data set (where the shape of the valleys represented by the target data set are smoothed). In one example, one or more FCT-ERROR value in the received training data records are changed to form smoothed training data records that may be stored in training database 35. FIG. 7 shows an example of TVS-RE curves generated from an exemplary smoothed threshold-voltage shift-read training data set. Because the smoothing function (104) is performed prior to training (105), the CNN inference model is not trained to predict the classification corresponding to the exact number of errors measured during the device's characterization step (performed in step 101 to form training data files input in step 103), but rather is trained to predict the reliability state corresponding to the smoothed threshold-voltage-shift-read training data set.

When the trained reliability-state CNN model fails to meet the testing criteria for a particular reliability state, the training data files corresponding to the reliability state failing to meet the testing criteria are changed (108) by removing training data records (or smoothed training data records) corresponding to one or more of the threshold voltage regions required to read the flash memory device and repeating (110) the training and testing of steps 105-106. Removing training data records (or smoothed training data records) corresponding to a particular TVSO region effectively removes the particular TVSO region (that may be referred to hereinafter as the "effectively-removed TVSO region") from the feature set of the CNN model for the reliability state failing to meet the testing criteria but not for other reliability states.

When the architecture of the representative flash memory device 33 is known such that the threshold voltage regions corresponding to the various pages are known, threshold voltage regions for pages that are less responsive to a particular current physical characteristic may be selected for removal from the training data set. In one example of a TLC, the training data records corresponding to TVSO values required to read the upper page (e.g., $TVSO_1$, $TVSO_3$, $TVSO_5$ and $TVSO_7$), the training data records corresponding to the TVSO values required to read the middle page or the training data records corresponding to TVSO values required to read the lower page are removed.

For example, if it is known from the flash characterization testing that the upper page is more sensitive to retention and if the reliability state is one in which retention is greater than zero, removal of records having nonzero TVSO values in threshold voltage regions corresponding to the lower or middle pages may produce better results. In some flash memory devices, the lower page corresponds to $TVSO_4$ and the middle page corresponds to $TVSO_2$ and $TVSO_6$. In one example, in the first iteration of step 108 training data records in which $TVSO_4$ values 63*a* is a nonzero value are removed (e.g., all training data records generated in the fourth scan) having an index 64 corresponding to the reliability state that failed to meet the test criteria in step 105 to remove the noise related to the lower page (feature sets for other reliability states are not changed) and the training and testing process of steps 105-106 is repeated. If the test criteria are still not met, training data records with nonzero $TVSO_2$ or $TVSO_6$ values are removed (e.g., all training data records from the second scan and the sixth scan) for the reliability state that failed to meet the test criteria in step 106 to remove the noise related to the middle page and the training and testing process of steps 105-106 is again repeated. In this example, the resulting training data record will only include nonzero values for $TVSO_1$, $TVSO_3$, $TVSO_5$ and $TVSO_7$ that are sensitive to retention (TVSO values required for reading the upper page), and those threshold voltage regions that primarily add noise to the classification model are removed.

When the architecture of the flash memory device 33 is not known, the determination of which TVSO regions need to be effectively removed may be determined iteratively. Alternatively, a sensitivity analysis is performed to identify the TVSO regions that vary the least during testing conditions corresponding to each reliability states and the identified TVSO regions that vary the least for a particular reliability state not meeting the test criteria in step 106 are selected for effective removal.

The process of steps 105-108 is repeated until testing criteria are met for each of the reliability states. When testing criteria are met for each of the reliability states, configuration files for the classification reliability-state CNN model are stored (109), and method 100 ends.

Optionally one or more TVSO value is also stored in step 109. In one embodiment all sets of FCT-TVSO values that do not include a nonzero value in an effectively-removed TVSO region are stored in step 109. In this embodiment all TVSO regions that are not effectively-removed TVSO regions are represented in the stored set(s) of FCT-TVSO values such that the sets of stored FCR-TVSO values represent only the TVSO regions that effectively remain in the feature set for all reliability states in the last iteration that produces the stored CNN. Thus, the stored TVSO value(s) are one or more set of FCR-TVSO values that were not removed from any instance of the training data set in step 108. In the previous example, one or all of the sets of FCR-TVSO values for the upper page ($TVSO_1$, $TVSO_3$, $TVSO_5$ and $TVSO_7$), can be stored in step 109 such as any of the sets of FCR-TVSO values in the first scan, any of the sets of FCR-TVSO values in the third scan, any of the sets of FCR-TVSO values in the fifth scan or any of the sets of FCR-TVSO values in the seventh scan.

In one example machine learning module 28 is operable to perform steps 106-108 and to store configuration files of the resulting reliability-state CNN model 38 and TVSO values (step 109) in data storage module 39. More particularly, machine learning module 28 is operable to generate the initial reliability-state CNN model, with the framework input into machine learning module 28 controlling the generation and testing of machine learning module 28 during the process of steps 103-109.

Optionally, once the testing criteria are met the configuration files for the reliability-state CNN model 12 is trimmed by removing unnecessary elements to obtain the final reliability-state CNN model 12. In one example those portions of the configuration file relating to the generating of the reliability-state CNN model 12 (e.g., hyperparameters) are removed and the remaining elements of the reliability-state CNN model 12 are converted into a different data format (e.g., converted from floating point to 40 bits fixed point) to speed up the inference time of the final reliability-state CNN model 12. Also, the conversion from floating point to fixed point enables a neural processing module 10 with a lower gate count and reduces latency.

Figure 8:
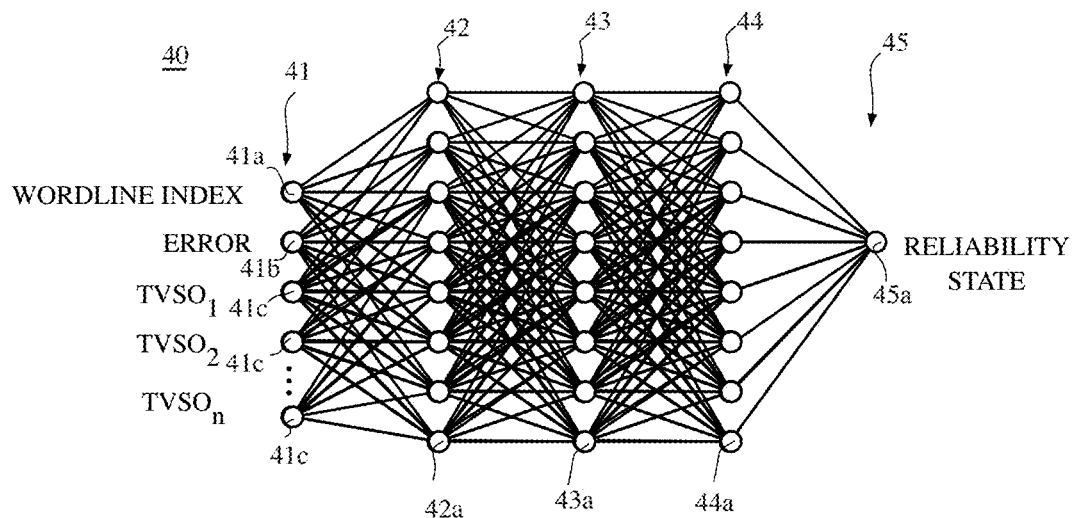
FIG. 8 is a block diagram illustrating a reliability-state CNN inference model having a single output neuron.
Figure 9:
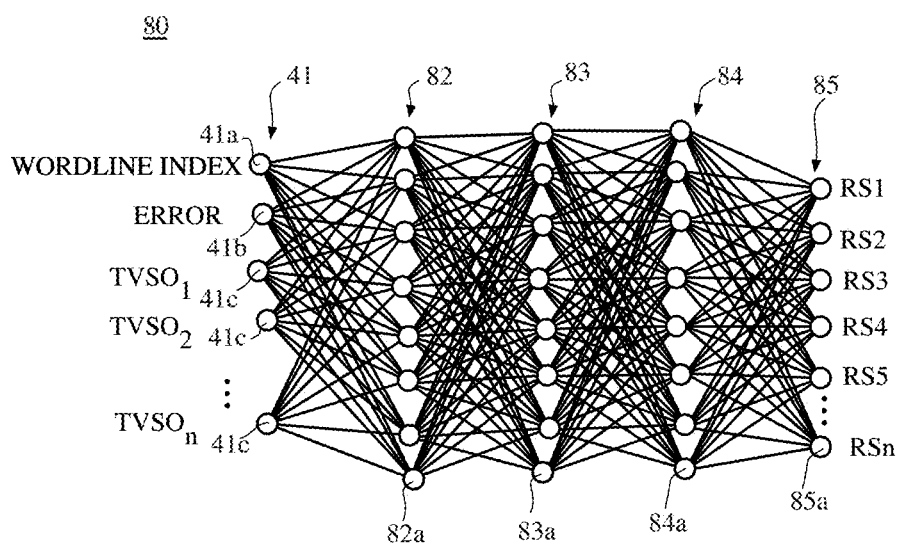
FIG. 9 is a block diagrams illustrating a reliability-state CNN inference model having an output neuron for each reliability state.

FIGS. 8-9 illustrate examples of reliability-state classification neural network models formed in accordance method 100. Reliability state CNN model 40 of FIG. 8 includes an input layer 41 that includes input neurons 41*a-c*, an output layer 45 that includes an output neuron 45*a* and layers 42-44 of hidden neurons 42*a*, 43*a* and 44*a*. In this embodiment a first input neuron 41*a* receives a number that identifies the wordline, such as a wordline index (WORDLINE INDEX). A second input neuron 41*b* receives a number of errors as input, i.e. receives the FTC-ERROR value during training, and may be referred to hereinafter as an "error-input neuron" (ERROR). The other input neurons (that may be referred to hereinafter as "TVSO-input neurons") 41*c* receive TVSO values (all TVSO values required to read the flash memory device 2), with a first TVSO-input neuron 41*c* configured to receive a first TVSO value corresponding to a first threshold voltage region of a flash memory device 2, a second TVSO-input neuron 41*c* configured to receive a second TVSO value corresponding to a second threshold voltage region of a flash memory device 2 and so forth such that n TVSO values are received as input.

FIG. 9 shows an embodiment in which the output layer 85 includes one output neuron 85*a* for each reliability state. Reliability-state CNN model has an input layer 41 that includes input neurons 41*a-c*, an output layer 85 that includes a plurality of output neurons 85*a* and layers 82-84 of hidden neurons 82*a*, 83*a* and 84*a*. In this embodiment the number of output neurons 85*a* is equal to the number of reliability states and each output neuron 85*a* indicates a number that is the probability that the class represented by the particular output node is the correct class. In this embodiment the output having the highest numerical value indicates the predicted reliability state. In one example an activation function is applied to the output layer 85 (e.g., softmax activation function) to assure that the probabilities sum to one.

FIG. 10 illustrates a method 200 for determining when actual wear of a flash memory device differs from one of a plurality of reliability states for the flash memory device. The actual wear of the flash memory device, usually measured with the RBER, which RBER generally increases as the flash ages, is responsive to the reliability state. A reliability-state CNN model is generated (201) that is configured to identify reliability states for a flash memory device. The term "reliability-state CNN model," as used in the present application includes all CNN models configured to predict a reliability state and specifically includes a reliability-state CNN model(s) 12 formed in accordance with method 100. In one example, the reliability-state CNN model 12 is generated as shown in method 100 of FIG. 1 by testing and model generating system 30 shown in FIG. 3.

Configuration files of the reliability-state CNN model are stored (202) on a flash controller or on a memory device that is coupled to the flash controller. The reliability-state CNN model 12 is configured to identify reliability states for the flash memory device 2. In one example data storage module 4 is configured for storing configuration files of the reliability-state CNN model 12. In one embodiment the reliability-state CNN model 12 is initially stored in data storage module 39 in the form of configuration files. Generation of the reliability-state CNN model 12 may be performed prior to sale and use of an SSD 11 and prior to delivery of a flash controller 3 to a customer for use in fabrication of an SSD 11. If it is performed prior to sale and use of an SSD 11 and prior to delivery of a flash controller 3 to a customer for use in fabrication of an SSD 11 it may be performed using a testing and model generation system and may be downloaded for installation into SSD 11 as configuration files of reliability-state CNN model 12.

One or more TVSO value(s) and tags corresponding to each reliability state are also stored in step 202 on the flash memory controller or on a memory device that is coupled to the flash controller. In one example, tags 18 and TVSO values 19 are stored in data storage module 4. In one example the TVSO value(s) that are stored in step 202 are some or all of the sets of FCR-TVSO values optionally stored in step 109.

The operation of a flash memory device is monitored (203) to identify one or more current physical characteristic values of the flash memory device. In one example, status module 5 is operable to monitor the operation of each flash memory device 2 to identify one or more current physical characteristic values of flash memory devices 2. The determined current physical characteristic values may be stored in in data storage module 4, in flash memory devices 2 or in memory device 13. The term "current physical characteristic value" as used in the present invention is a value determined during usage of a flash memory device 2 by the flash controller 3 that can affect threshold voltage distribution such as, for example, a value indicating the current age/physical degradation of the location that is to be read such as the number of P/E cycles of a particular location that is to be read or indicating the current transitory characteristics of the location that is to be read (e.g., read disturb and retention time).

In the present embodiment current physical characteristic values include a read disturb value. In one example, each time that a block is closed, status module 5 is operable to count the number of reads of the block while the block is closed and the number of reads of the block while the block is closed is stored as a read disturb value. When a block is erased the read disturb value of the erased block is reset to zero.

In the present embodiment current physical characteristic values include a retention time value. In one example, each time that a block is closed, status module 5 is operable to start a timer to determine the amount of time that has elapsed since the block was closed. The elapsed time as determined by the timer at any point in time is defined as a retention time value. When a block is erased the timer for that block is stopped and the retention time value of the erased block is reset to zero.

In the present embodiment current physical characteristic values include a number indicating the number of program and erase operations of each block. In one example, status module 5 is operable for counting the number of program and erase cycles of each block of the flash memory device 2 during the entire lifetime of the flash memory device 2 and storing the count in data storage module 4 or memory device 13.

A set of TVSO-RC values, i.e. the TVSO values currently being used to perform reads of the flash memory are identified (204). In one example, read module 6 of FIG. 1 is operable to identify one or more TVSO-RC values to be used to perform the read by looking up a wordline (or block) to be read in TVSO selection table 17 in accordance with the normal read process of flash controller 3. For example, TVSO-RC values may be determined immediately prior to each read based on the physical location to be read (e.g., block/page to be read) and the current physical characteristics of the flash memory device 2 to be read as identified by the flash controller 3 by performing a look-up operation in a look-up table 17 using the physical location to be read and the identified current physical characteristics of the flash memory device 2 (e.g., number of program/erase cycles, retention time, read disturb value for the block to be read). In one example control module 9 instructs status module 5 to provide the current physical characteristics for the block of the flash memory device 2 to be read. Status module 5 responds with the current physical characteristics of the block of the flash memory device 2 to be read (e.g., the current number of P/E cycles, retention time and the number of read disturb value for the block to be read). Control module 9 then performs a look up operation on TVSO selection table 17 to identify the TVSO-RC values to use for performing the read. The TVSO-RC values may initially be the TVSOmin values identified in step 101 for the wordline and block to be read but may be other values, depending on how the flash controller 3 adjusts for changing conditions as flash memory devices 2 age.

One or more read of the flash memory device is performed (205) at the TVSO value(s) stored in step 202 to determine a number of errors for the flash memory device. In one embodiment, in step 202, the set of TVSO value(s) are stored in data storage module 4 and control module 9 is operable to retrieve it and send it to read module 6 along with a read instruction. Read module 6 then sends a threshold-voltage-shift read instruction 24 to the flash memory device 2 to be read, that indicates the TVSO value(s) stored in step 202 to be used for performing the read along with an indication of the wordline and page to be read. In response, microcontroller 22 reads the respective memory array 23 and outputs the read results at registers 21. The read results are received at read module 6 which sends the read results to decode module 7. Decode module 7 is operable to decode the read results to obtain the stored codeword and identify the number of errors in the read, which may be referred to as the current read error or "CR-ERROR".

The read of step 205 could use any set of FCT-TVSO values used to train the CNN model. However, there is the possibility that the selected FCT-TVSO may have been effectively removed from the feature set relating to a particular reliability state (e.g. a removed-TVSO region) during the process of generating the CNN, which could result in an erroneous reliability state prediction. To prevent that possibility, the read of step 202 uses one of the set(s) of TVSO values that are stored in step 109 of FIG. 4 (one of the sets of FCT-TVSO values that does not include a nonzero value in an effectively-removed TVSO region). Though any set of FCR-TVSO values that does not include a nonzero value in an effectively-removed TVSO region could be stored in step 202 and used for the read of step 205, in one embodiment only one set of FCR-TVSO values is stored in step 202 and is used for the read of step 205 (e.g., a single one of the sets of TVSO values that does not include a nonzero value in an effectively-removed TVSO region).

A neural network operation of the reliability-state CNN is performed (206), using as input the identified set of TVSO-RC values and CR-ERROR, to identify a predicted reliability state. In one example neural processing module 10 is configured to perform a neural network operation using the stored configuration files and using as input to the neural network operation the TVSO-RC values and CR-ERROR value to identify a predicted reliability state. In the example of FIG. 1, control module 9 is operable to load the configuration files of the reliability-state CNN model 12 into neural processing module 10 to form a reliability-state CNN core, where the term reliability-state CNN core refers to a loaded reliability-state model. Control module 9 couples the input required for the neural network operation to the reliability-state CNN core in neural processing module 10 and a neural network operation is performed by neural processing module 10 on the reliability-state CNN core. In the embodiment shown in FIGS. 8-9 the wordline index of the wordline read in step 205 is provided to input neuron 41a, the CR-ERROR value is input into neuron 41b and TVSO-RC values are input into input neurons 41c. More particularly, for a TLC flash memory device 2, a first TVSO-input neuron 41c receives as input a $TVSO-RC_1$ value corresponding to a first threshold voltage region of a flash memory device 2, a second TVSO-input neuron 41c receives as input a $TVSO-RC_2$ value corresponding to a second threshold voltage region of a flash memory device 2, a third input neuron 41c receives as input a $TVSO-RC_3$ value corresponding to a third threshold voltage region of a flash memory device 2 and so forth to $TVSO-RC_n$ value corresponding to a seventh threshold voltage region of flash memory device 2. When reliability-state CNN 40 or 80 of FIGS. 7-8 are used for classifying QLC flash memory devices, CNN 40 includes fifteen TVSO-input neurons 41c that receive fifteen TVSO-RC values. When reliability-state CNN 40 or 80 of FIGS. 7-8 are used for classifying PLC flash memory devices, fifteen TVSO-input neurons 41c receive fifteen corresponding TVSO-RC values. When reliability-state CNN 40 or 80 of FIGS. 7-8 are used for classifying PLC flash memory devices, thirty one TVSO-input neurons 41c receive thirty one corresponding TVSO-RC values.

In the embodiment shown in FIG. 8, output neuron 45a generates as output a value identifying the predicted reliability state (RELIABILITY STATE). In one example an output value of 1 indicates a first predicted reliability state, an output of 2 indicates a second predicted reliability state, and so forth. In the embodiment shown in FIG. 9 output is generated at each of output neurons 85a and control module 9 is operable to identify the output having the highest value as the predicted reliability state.

The identified current physical characteristic values are compared (207) to corresponding tags associated with the predicted reliability state. In one example control module 9 is configured to compare the identified current physical characteristic values to corresponding tags associated with the predicted reliability state. In one example, tags corresponding to each reliability state are stored in a table 18 in data storage module 4, with the table including the corresponding RSI. In this example, control module 9 identifies the tags corresponding to the predicted reliability state by performing a look-up operation on the stored table 18 using the RSI of the predicted reliability state.

A flag or other indication is stored (208, 211) when the comparison of step 207 indicates that the identified current physical characteristic values do not correspond to the respective tags associated with the predicted reliability state. In one example, control module 9 is configured to generate and store a flag 16 when the comparison indicates that the identified current physical characteristic values do not correspond to the tags associated with the predicted reliability state.

When the current physical characteristics correspond to the respective tags the wordline and/or page is changed (209) and the process of steps 203-209 is repeated as shown by line 210. In one example steps 203-208 are performed in the background on the same wordline and in subsequent iterations the page is changed to read a wordline more than once (e.g., when a wordline includes more than one page, such that all pages of the wordline to be tested are read). When all pages of a wordline have been read the wordline is changed in step 209 such that the process of steps 203-209 cycles through some or all of the wordlines in a flash memory device 2. In one example, the page and/or wordline is changed in step 209 to test all pages all wordlines of a flash memory device 2. The process of steps 203-209 then proceeds to a different flash memory device 2 such that all flash memory devices 2 are tested.

In one example the identified current physical characteristic values include a number of P/E cycles and the tags associated with the predicted reliability state include a tag indicating a range of P/E cycles; and the comparing of step 207 determines, that the identified current physical characteristic values do not correspond to the tags associated with the predicted reliability state when the identified number of P/E cycles is not within the range of P/E cycles.

In one example, the identified current physical characteristic values include a retention time value and the tags associated with the predicted reliability state include a tag indicating a range of retention times; and the comparing of step 207 determines that the identified current physical characteristic values do not correspond to the tags associated with the predicted reliability state when the retention time value is not within the range of retention times.

In one example, the identified current physical characteristic values include the number of P/E cycles and the retention time value and the comparison of step 207 determines that the identified current physical characteristic values do not correspond to the tags associated with the predicted reliability state when the number of P/E cycles is not within the range of P/E cycles or when the retention time value is not within the range of retention times.

In another example, the identified current physical characteristic values include a read disturb value and the tags associated with the predicted reliability state include a tag indicating a range of read disturb values; and the comparison of step 207 determines that the identified current physical characteristic values do not correspond to the tags associated with the predicted reliability state when the read disturb value is not within the range of read disturb values.

In another example, the identified current physical characteristic values include a temperature value and the tags associated with the predicted reliability state include a tag indicating a range of temperature values; and the comparison of step 207 determines that the identified current physical characteristic values do not correspond to the tags associated with the predicted reliability state when the temperature value is not within the range of temperature values.

In another example, the identified current physical characteristic values include the number of P/E cycles, the retention time value and the read disturb value; and the comparison of step 207 determines that the identified current physical characteristic values do not correspond to the tags associated with the predicted reliability state when the number of P/E cycles is not within the range of P/E cycles, when the retention time value is not within the range of retention times or when the read disturb value is not within the range of read disturb values.

In one example, control module 9 is configured to store flag 16 in data storage module 4. For example, one or more files may include the stored flags 16. The indication may also be an entry into a bad block table stored in data storage module 4 or in a corresponding flash memory device 2. When the indication includes marking a block as a "bad block", the block is retired and will not be used to store data in subsequent operations. In another embodiment, instead of retiring the block, control module 9 may run other operations such as a deep read voltage reference calibration to attempt to recover the block, or a fine grained read voltage threshold calibration process to recover the RBER of the block.

Example A

In one example P/E cycles are divided into two ranges: 0 k-1,000 P/E cycles and 1,000-2,000 P/E Cycles. Retention time (RET) is divided into two ranges: 0-12 hours and 12-24 hours. Read disturb (RD) is divided into two ranges: 0-100,000 disturbs and 100,000-200,000 disturbs. Temperature (T) is divided into two ranges 25-40 degrees Centigrade (C) and 40-70 degrees C. In this example, the total number of reliability states is 16 so the following tags will be stored, where the last number following the arrow is the RSI:

P/E=0 k-1 k, RET=0 h-12 h, RD=0-100 k, T=25 C-40 C→0
P/E=0 k-1 k, RET=0 h-12 h, RD=0-100 k, T=40 C-70 C→1
P/E=0 k-1 k, RET=0 h-12 h, RD=100-200 k, T=25 C-40 C→2
P/E=0 k-1 k, RET=0 h-12 h, RD=100-200 k, T=40 C-70 C→3
P/E=0 k-1 k, RET=12 h-24 h, RD=0-100 k, T=25 C-40 C→4
P/E=0 k-1 k, RET=12 h-24 h, RD=0-100 k, T=40 C-70 C→5
P/E=0 k-1 k, RET=12 h-24 h, RD=100-200 k, T=25 C-40 C→6
P/E=0 k-1 k, RET=12 h-24 h, RD=100-200 k, T=40 C-70 C→7
P/E=1 k-2 k, RET=0 h-12 h, RD=0-100 k, T=25 C-40 C→8
P/E=1 k-2 k, RET=0 h-12 h, RD=0-100 k, T=40 C-70 C→9
P/E=1 k-2 k RET=0 h-12 h, RD=100-200 k, T=25 C-40 C→10
P/E=1 k-2 k, RET=0 h-12 h, RD=100-200 k, T=40 C-70 C→11
P/E=1 k-2 k, RET=12 h-24 h, RD=0-100 k, T=25 C-40 C→12
P/E=1 k-2 k, RET=12 h-24 h, RD=0-100 k, T=40 C-70 C→13
P/E=1 k-2 k, RET=12 h-24 h, RD=100-200 k, T=25 C-40 C→14
P/E=1 k-2 k, RET=12 h-24 h, RD=100-200 k, T=40 C-70 C→15.

In one embodiment if there is an indication that the firmware image is corrupted during a firmware update or upgrade, at drive startup some or all of the steps of method 200 are performed to determine whether identified current physical characteristic values correspond to the respective tags associated with the predicted reliability state and if the method determines that all reliability states are in agreement with, or within an acceptable range of, predicted reliability states, normal operation commences prior to running foreground threshold voltage shift calibration on all blocks of all flash memory devices 2 in the SSD 11. This allows for faster startup and allows for threshold voltage shift calibration to subsequently be run in the background. This allows the user to access the SSD 11 more quickly, improving the drive's bandwidth, latency and QoS.

Because the neural network operations of step 206 incorporates errors from one or more recent read and the TVSO-CR values, the present embodiments take into account offline-retention time and offline-temperature as it is reflected in the predicted reliability state. Accordingly, the method and apparatus compensates for offline-retention time and offline temperature so as to prevent the use of an incorrect TVSO value for performing a read, that may result in read errors.

In the above examples, a single read is used to generate each training record. However, since characterization testing of step 101 tests a number of representative flash memory devices which results in numerous data records, the number of data records can be reduced by performing the above scan-read process for each of the flash memory devices to be tested and averaging the results. In one embodiment reads are combined such that the FTC-ERROR value represents the errors from reads of more than one representative memory device at a particular set of TVSO values.

Though embodiments of the present invention are described as "firmware" it is appreciated that embodiments of the present invention may or may not include firmware, with software embodiments including one or more software programs for performing some or all of the methods of the present invention. In one specific embodiment of the present invention, a software stack is stored in data storage module 4 that is operable on one or more processor (e.g., in control module 9) to perform the methods of the present application.

The methods and apparatus of the present invention provides an indication of the age of structures of flash memory devices 2 independently of the measured physical characteristics for the flash memory device 2; allows for faster recovery when the firmware image is corrupted during a firmware update or upgrade; and compensates for the effects of offline-retention time and offline-temperature when the SSD 11 is in a low power state or powered down.

In the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

What is claimed is:

1. A method for generating a reliability-state classification neural network (CNN) model for a flash memory device that can be read by sending to the flash memory device a threshold-voltage-shift read instruction that includes a Threshold Voltage Shift Offset (TVSO) value for each threshold voltage region required for reading the flash memory device, the method comprising:
   receiving input indicating a framework for the reliability-state CNN model, the framework including testing criteria and a training algorithm;
   receiving training data files indicating, for each of a plurality of different wordlines, a Flash Characterization Testing Error (FCT-ERROR) value indicating a number of flash characterization testing errors, a label indicating one of a plurality of reliability states and a set of minimum-Threshold-Voltage-Shift-Offset (TVSOmin) values;

performing training to generate the reliability-state CNN model using a training data set that includes the received training data files, the reliability-state CNN model configured to predict the reliability state of the flash memory device;

testing the reliability-state CNN model to determine if the reliability-state CNN model can predict each of the reliability states using the training data set, the testing including determining whether the testing criteria are met for each of the reliability states;

when the trained classification neural network model fails to meet the testing criteria for a particular reliability state, removing from the training data files corresponding to the reliability states failing to meet the testing criteria training data files having a nonzero TVSO value in a particular TVSO region, to form an updated training data set and repeating the training and testing using the updated training data set; and when testing criteria are met for each of the reliability states, storing configuration files for the reliability-state CNN model.

2. The method of claim 1 further comprising performing a smoothing function on the received training data files to generate a smoothed training data set, the training using the smoothed training data set.

3. The method of claim 1 wherein the removing training data files having a nonzero TVSO value in a particular TVSO region further comprises removing all training data files having a nonzero TVSO value in a TVSO region required to read a particular page type.

4. The method of claim 1 wherein the testing determines a percentage of correct classifications for each reliability state and the testing criteria comprises a percentage threshold.

5. The method of claim 1 further comprising testing representative flash memory devices to identify the FCT-ERROR values and the set of TVSOmin values.

6. The method of claim 3 further comprising:
when testing criteria are met for each of the reliability states, storing one or more set of TVSO values.

7. A method for determining when actual wear of a flash memory device differs from one of a plurality of reliability states for the flash memory device, the method comprising:
storing configuration files of a reliability-state classification neural network (CNN) model on a flash controller or on a memory device that is coupled to the flash controller, the reliability-state CNN model configured to identify the reliability states for the flash memory device;
storing one or more Threshold Voltage Shift Offset (TVSO) values;
monitoring the operation of the flash memory device to identify one or more current physical characteristic values of the flash memory device;
identifying a set of TVSO values currently being used to perform reads of the flash memory device;
performing a read of the flash memory device at the stored one or more TVSO value to determine a number of errors for the flash memory device;
performing a neural network operation of the reliability-state CNN model, using as input the set of TVSO values currently being used to perform reads of the flash memory device and the determined number of errors for the flash memory device, to identify a predicted reliability state;
comparing the identified current physical characteristic values to corresponding tags associated with the predicted reliability state; and
storing a flag or other indication when the comparison indicates that the identified current physical characteristic values do not correspond to the respective tags associated with the predicted reliability state.

8. The method of claim 7 wherein the identified current physical characteristic values include a number of program and erase cycles and wherein the tags associated with the predicted reliability state include a first tag indicating a range of program and erase cycles, the comparing determining that the identified current physical characteristic values do not correspond to the tags associated with the predicted reliability state when the number of program and erase cycles is not within the range of program and erase cycles.

9. The method of claim 8 wherein the identified current physical characteristic values include a retention time value and wherein the tags associated with the predicted reliability state include a second tag indicating a range of retention times, the comparing determining that the identified current physical characteristic values do not correspond to the tags associated with the predicted reliability state when the retention time value is not within the range of retention times.

10. The method of claim 9 wherein the identified current physical characteristic values include a read disturb value and wherein the tags associated with the predicted reliability state include a third tag indicating a range of read disturb values, the comparing determining that the identified current physical characteristic values do not correspond to the tags associated with the predicted reliability state when the read disturb value is not within the range of read disturb values.

11. The method of claim 7 wherein the storing one or more TVSO values further comprises storing a set of Flash-Characterization-Read-Threshold-Voltage Shift Offset (FCR-TVSO) values that was used in the training and that was not removed from the training data set during the training.

12. A flash controller including a write module configured to write data to a flash memory device; a read module configured to perform a read of the flash memory device by sending a threshold-voltage-shift read instruction to the flash memory device that includes a Threshold Voltage Shift Offset (TVSO) value for each threshold voltage region required for reading the flash memory device, a decode module configured to decode the results of the read, and a status module for monitoring the operation of the flash memory device to identify one or more current physical characteristic values, the flash controller comprising:
a data storage module configured for storing configuration files of a reliability-state classification neural network (CNN) model that is configured to identify reliability states for the flash memory device and configured for storing one or more TVSO value that was used in the training of the reliability-state CNN model;
a control module coupled to the data storage module, the control module configured to identify a set of TVSO values currently being used to perform reads of the flash memory device and configured to instruct the read module to perform a read of the flash memory device at the stored one or more TVSO value,
wherein, in response to the instruction, the read module is configured to perform the read of the flash memory device at the stored one or more TVSO value and the decode module is configured to determine a number of errors using the results of the one or more read; and a neural processing module coupled to the data storage module and to the control module, the neural processing module configured to perform a neural network operation using the stored configuration files and using as input to the neural network operation the identified set of TVSO values currently being used to perform reads of the flash memory device and the determined number of errors to identify a predicted reliability state, wherein the control module is configured to compare the identified current physical characteristic values to corresponding tags associated with the predicted reliability state and is configured to store a flag or other indication when the comparison indicates that the identified current physical characteristic values do not correspond to the tags associated with the predicted reliability state.

13. The flash controller of claim 12 wherein the control module is configured to store the flag in the data storage module.

14. The flash controller of claim 12 wherein the identified current physical characteristic values include a number of program and erase cycles and wherein the tags associated with the predicted reliability state include a first tag indicating a range of program and erase cycles, the comparing determining that the identified current physical characteristic values do not correspond to the tags associated with the predicted reliability state when the number of program and erase cycles is not within the range of program and erase cycles.

15. The flash controller of claim 12 wherein the identified current physical characteristic values include a retention time value and wherein the tags associated with the predicted reliability state include a second tag indicating a range of retention times, the comparing determining that the identified current physical characteristic values do not correspond to the tags associated with the predicted reliability state when the retention time value is not within the range of range of retention times.

16. The flash controller of claim 12 wherein the identified current physical characteristic values include a temperature value and wherein the tags associated with the predicted reliability state include a tag indicating a range of temperature values, the comparing determining that the identified current physical characteristic values do not correspond to the tags associated with the predicted reliability state when the temperature value is not within the range of temperature values.

17. The flash controller of claim 12 wherein the identified current physical characteristic values include a read disturb value and wherein the tags associated with the predicted reliability state include a second tag indicating a range of read disturb values, the comparing determining that the identified current physical characteristic values do not correspond to the tags associated with the predicted reliability state when the read disturb value is not within the range of range of read disturb values.

18. The flash controller of claim 12 wherein the stored one or more TVSO value was used in the training of the reliability-state CNN model and was not effectively removed from the training data set during the training of the reliability-state CNN model.

* * * * *